United States Patent
Dutt et al.

(10) Patent No.: US 9,710,578 B2
(45) Date of Patent: Jul. 18, 2017

(54) CONFIGURATION OF SELECTED MODULES OF A HARDWARE BLOCK WITHIN A PROGRAMMABLE LOGIC DEVICE

(71) Applicant: Lattice Semiconductor Corporation, Hillsboro, OR (US)

(72) Inventors: Debaprosad Dutt, Fremont, CA (US); Jamie Freed, Fleetwood, PA (US); Harish Venkatappa, San Jose, CA (US); Pradeep Lenka, Fremont, CA (US); Minghao Ni, Shanghai (CN)

(73) Assignee: Lattice Semiconductor Corporation, Portland, OR (US)

( * ) Notice: Subject to any disclaimer, the term of this patent is extended or adjusted under 35 U.S.C. 154(b) by 484 days.

(21) Appl. No.: 14/053,026

(22) Filed: Oct. 14, 2013

(65) Prior Publication Data

US 2014/0109031 A1    Apr. 17, 2014

Related U.S. Application Data

(60) Provisional application No. 61/714,636, filed on Oct. 16, 2012, provisional application No. 61/756,609, filed on Jan. 25, 2013.

(51) Int. Cl.
*G06F 17/50*    (2006.01)

(52) U.S. Cl.
CPC ................ *G06F 17/5027* (2013.01)

(58) Field of Classification Search
CPC ............ G06F 17/5054; G06F 17/5045; G06F 17/5072; G06F 17/505; G06F 17/5038
USPC ......................................... 716/116, 117, 138
See application file for complete search history.

(56) References Cited

U.S. PATENT DOCUMENTS

| | | |
|---|---|---|
| 7,669,164 B1 | 2/2010 | Ma et al. |
| 7,685,541 B1 | 3/2010 | Stroomer et al. |
| 8,146,027 B1 | 3/2012 | Lindop et al. |
| 8,196,075 B1 | 6/2012 | Garrault et al. |
| 8,402,400 B1 | 3/2013 | Perry |
| 2008/0134127 A1* | 6/2008 | Allen et al. ................ 716/17 |
| 2010/0058276 A1* | 3/2010 | Felder et al. .............. 716/17 |
| 2010/0241882 A1* | 9/2010 | Diab et al. ................ 713/320 |

* cited by examiner

*Primary Examiner* — Vuthe Siek (57) ABSTRACT

Various techniques are provided to configure embedded hardware resources of a programmable logic device (PLD). In one example, a method includes receiving configuration information for a plurality of hardware modules of an embedded hardware block of a PLD. The configuration information is received from a user of a computer system external to the PLD. The method also includes generating a plurality of models of the hardware block. The method also includes merging the generated models into a combined model of the hardware block. The combined model includes the configuration information received for the hardware modules of the hardware block. Related systems and additional techniques are also provided.

20 Claims, 5 Drawing Sheets

FIG. 6

CONFIGURATION OF SELECTED MODULES OF A HARDWARE BLOCK WITHIN A PROGRAMMABLE LOGIC DEVICE

CROSS-REFERENCE TO RELATED APPLICATIONS

This application claims the benefit of U.S. Provisional Patent Application No. 61/714,636 filed Oct. 16, 2012 which is hereby incorporated by reference in its entirety.

This application claims the benefit of U.S. Provisional Patent Application No. 61/756,609 filed Jan. 25, 2013 which is hereby incorporated by reference in its entirety.

TECHNICAL FIELD

The present invention relates generally to programmable logic devices and, more particularly, to user configuration of embedded hardware in such devices.

BACKGROUND

Programmable logic devices (PLDs) (e.g., field programmable gate arrays (FPGAs)), complex programmable logic devices (CPLDs), field programmable system on a chips (FPSCs), or other types of programmable devices) generally include programmable logic blocks which may be configured to implement various operations. Some PLDs also include configurable embedded hardware to support additional operations. However, conventional approaches to configuring such embedded hardware are often cumbersome and unwieldy.

For example, in one approach, embedded hardware and programmable logic blocks may be configured in a shared hardware description language (HDL) hierarchy. However, such a hybrid hardware/programmable logic block HDL hierarchy is complex, time consuming to validate, and may not be easily reused for other applications (e.g., having limited portability).

In another approach, multiple embedded hardware resources may be implemented as a shared block that interfaces with programmable logic blocks in other HDL hierarchies. However, such hardware block sharing can be problematic, as changes to the configuration of one or more shared hardware resources in the block can inadvertently affect the interoperation of the hardware resources with many programmable logic blocks. Such problems are further compounded when additional vendor-provided logic (e.g., soft intellectual property (IP) core logic implemented in programmable logic blocks of the PLD) is used to interface between the embedded hardware and other user-configured programmable logic blocks.

Accordingly, there is a need for an improved approach to configuring hardware resources of a PLD.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various embodiments set forth herein, techniques are provided to permit convenient configuration of hardware resources embedded in programmable logic devices (PLDs). For example, in some embodiments, a PLD includes an embedded hardware block having a plurality of hardware modules. The hardware modules are selectively configured by a user in accordance with a desired application.

A plurality of models of the hardware block are generated, wherein each model is a specific instance of a general model of the hardware block. Each model instance includes configuration information for a subset of the hardware block (e.g., a corresponding one or more of the hardware modules configured by the user). The various model instances are merged together to provide a combined model of the hardware block, including configuration information for the particular configured hardware modules. As a result, the hardware block may be efficiently configured and modeled without redundancy or hardware resource conflicts.

Figure 1:
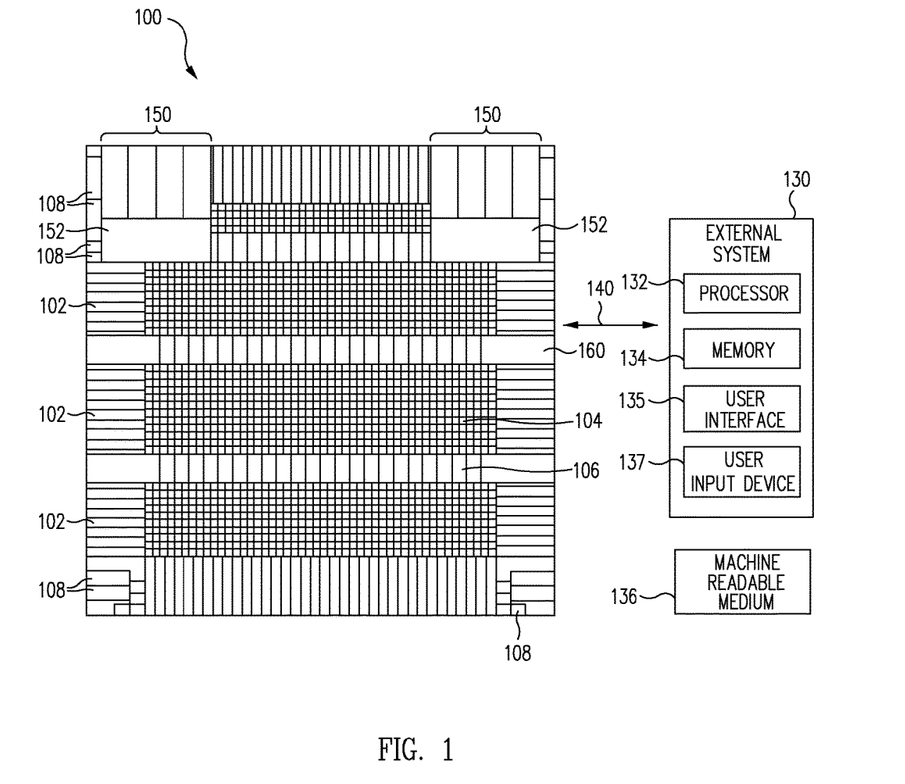
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 also includes hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., PLL and/or DLL circuits), and/or various routing resources as appropriate. In general, the various elements of PLD 100 may be used to perform their intended functions for desired applications, as would be understood by one skilled in the art.

For example, I/O blocks 102 may be used for programming PLD 100, such as memory 106 or transferring information (e.g., various types of data and/or control signals) to/from PLD 100 through various external ports as would be understood by one skilled in the art. I/O blocks 102 may provide a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104 and hard IP blocks 160, to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration of PLD 100 and generate corresponding configuration data to program (e.g., configure) PLD 100. For example, external system 130 may provide such configuration data to one or more I/O blocks 102, SERDES blocks 150, and/or other portions of PLD 100. As a result, programmable logic blocks 104 and various hardware of PLD 100 may be configured to operate in accordance with user-specified applications.

In the illustrated embodiment, external system 130 is implemented as a computer system. In this regard, external system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, external system 130 may run PLD configuration software, such as Lattice Diamond System Planner software available from Lattice Semiconductor Corporation of Hillsboro, Oreg. to permit a user to create a desired configuration and generate corresponding configuration data to program PLD 100.

External system 130 also includes, for example, a user interface 135 (e.g., a screen or display) to display information to a user, and one or more user input devices 137 (e.g., a keyboard, mouse, trackball, touchscreen, and/or other device) to receive user commands to prepare a desired configuration of PLD 100.

Figure 2:
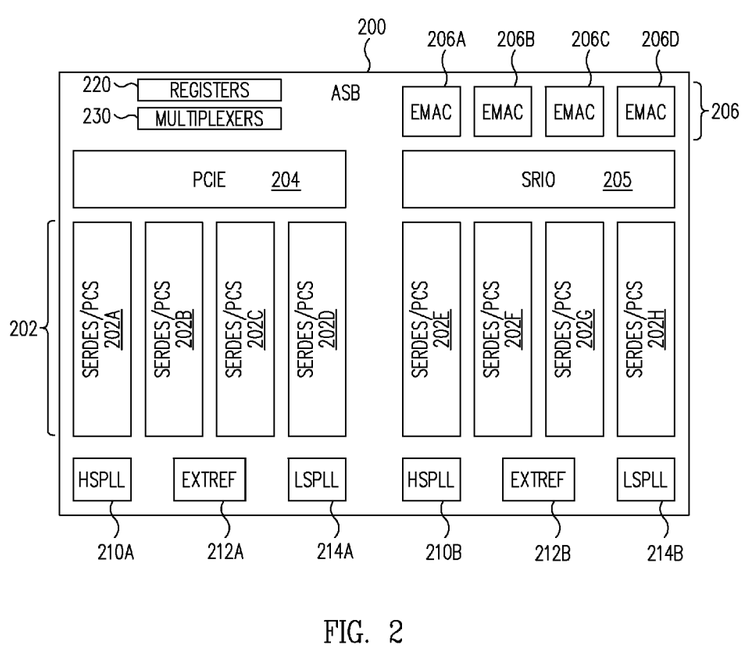
FIG. 2 illustrates a block diagram of hardware modules of a PLD that may be configured by a user in accordance with an embodiment of the disclosure.

In some embodiments, various hardware resources of PLD 100 may be organized in a hardware block referred to as an application specific block (ASB). For example, FIG. 2 illustrates a block diagram of an ASB 200 having various hardware modules in accordance with an embodiment of the disclosure.

In some embodiments, ASB 200 may be positioned in a particular region of PLD 100 (e.g., the various hardware modules of ASB 200 may be substantially co-located). In other embodiments, the various hardware modules of ASB 200 may be logically associated with ASB 200, but distributed throughout various regions of PLD 100.

As shown, ASB 200 may include various hardware modules that may be configured by operation of external system 130. For example, in the illustrated embodiment, ASB 200 includes SERDES/PCS modules 202 (labeled 202A-H), a Peripheral Computer Interface Express (PCIe) module 204, a Serial RapidIO (SRIO) module 205, Ethernet media access control (EMAC) modules 206 (labeled 206A-D), HSPLL (high speed SERDES phase-locked loop) modules 210 (labeled 210A-B), EXTREF modules (SERDES reference clock input buffers) 212 (labeled 212A-B), and LSPLL (low speed SERDES phase-locked loop) modules 214 (labeled 214A-B). The various modules shown in FIG. 2 are provided only for purposes of example. Accordingly, other types of modules and greater or fewer numbers of modules may be provided in various embodiments.

In some embodiments, the various hardware modules of ASB 200 may be implemented in PLD 100. For example, in some embodiments: SERDES/PCS modules 202 (labeled 202A-H) may be implemented by SERDES blocks 150 and PCS blocks 152 of PLD 100; PCIe module 204, SRIO module 205, and EMAC modules 206 may be implemented by hard IP blocks 160 to support appropriate communications by PLD; HSPLL modules 210 and LSPLL modules 214 may be implemented by clock-related circuitry 108; and EXTREF modules 212 may be implemented by I/O blocks 102 to provide SERDES reference clock input buffers.

Figure 3:
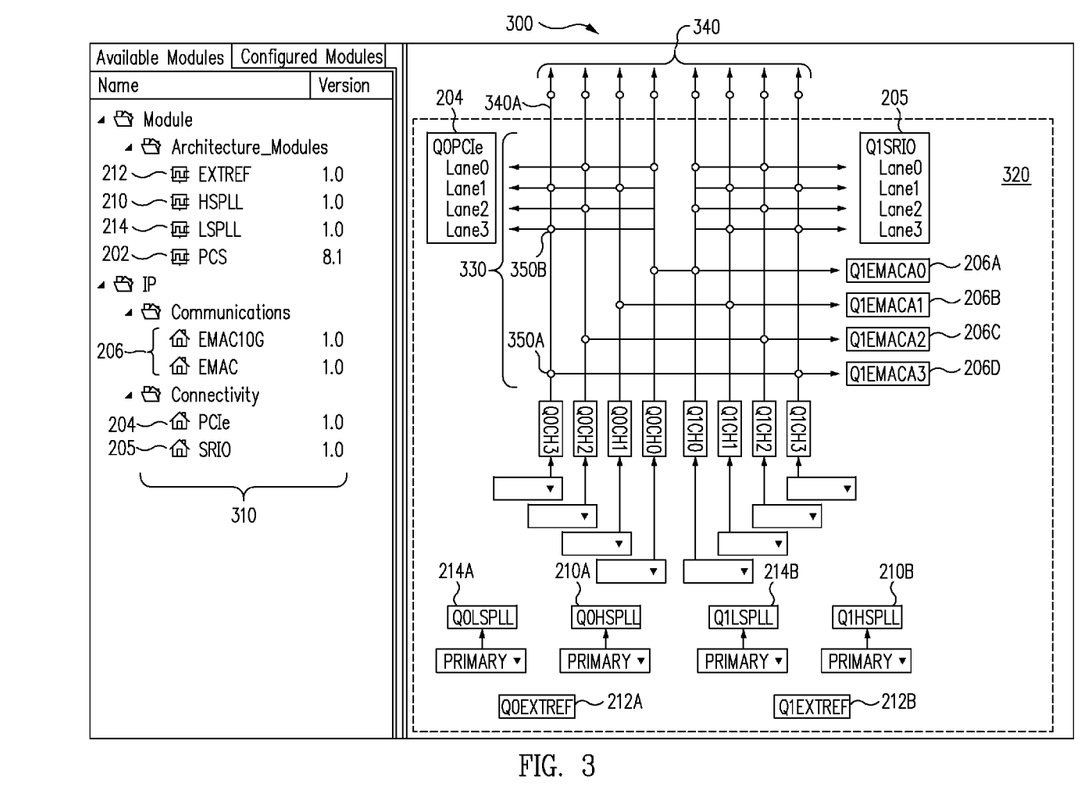
FIG. 3 illustrates a graphical user interface to configure hardware modules of a PLD in accordance with an embodiment of the disclosure.

The hardware modules of ASB 200 may be selectively interconnected with each other and/or programmable logic blocks 104 through various communication channels (see FIG. 3). For example, registers 220 may store various configuration data to route signals to and/or from the hardware modules through multiplexers 230. Registers 220 may store other configuration data as desired. In some embodiments, one or more hardware modules of ASB 200 may pass signals between programmable logic blocks 104 and external ports of PLD 100.

FIG. 3 illustrates a graphical user interface (GUI) 300 to configure hardware modules of a PLD in accordance with an embodiment of the disclosure. For example, in some embodiments, GUI 300 may be provided by user interface 135 of external system 130 while processor 132 runs Lattice Diamond software.

As shown in FIG. 3, user interface 300 includes a list 310 of hardware modules and a placement area 320. List 310 includes the various hardware modules of ASB 200 previously discussed with regard to FIG. 2. Placement area 320 illustrates the layout and interconnections between the hardware modules.

A user may specify a desired configuration of the hardware modules by selecting one or more particular hardware modules from list 310 and adding the selected hardware modules to placement area 320 (e.g., by drag-and-drop techniques). The user may further specify a desired configuration by, for example, selecting clocks to synchronize the hardware modules, connecting the hardware modules to various signal paths, and/or selecting other attributes of the hardware modules as appropriate. The user-specified configuration of the hardware modules may be collectively stored by external system 130 as configuration information included in various generated models as further described herein.

For example, in some embodiments, the user may interact with placement area 320 to selectively connect the hardware modules (e.g., by connections 350 such as particular connections labeled 350A-B) to various signal paths (e.g., lanes 330 and channels 340) used to send and/or receive signals between other hardware modules and/or programmable logic blocks 104 (e.g., corresponding to appropriate configurations of registers 220 and multiplexers 230 of ASB 200). In various embodiments, any desired aspects of the hardware modules may be configured by the user interacting with user interface 300.

In some embodiments, the various hardware modules displayed to the user in list 310 and/or in placement area 320 may have a one-to-one correspondence with the actual hardware modules of ASB 200. As a result, the user is presented with the actual hardware modules of ASB 200 that are available to be configured. Moreover, by displaying only hardware modules that have been selected by the user in placement area 320, the user can efficiently create a desired design without excessive clutter or an overwhelming number of options.

Figure 4:
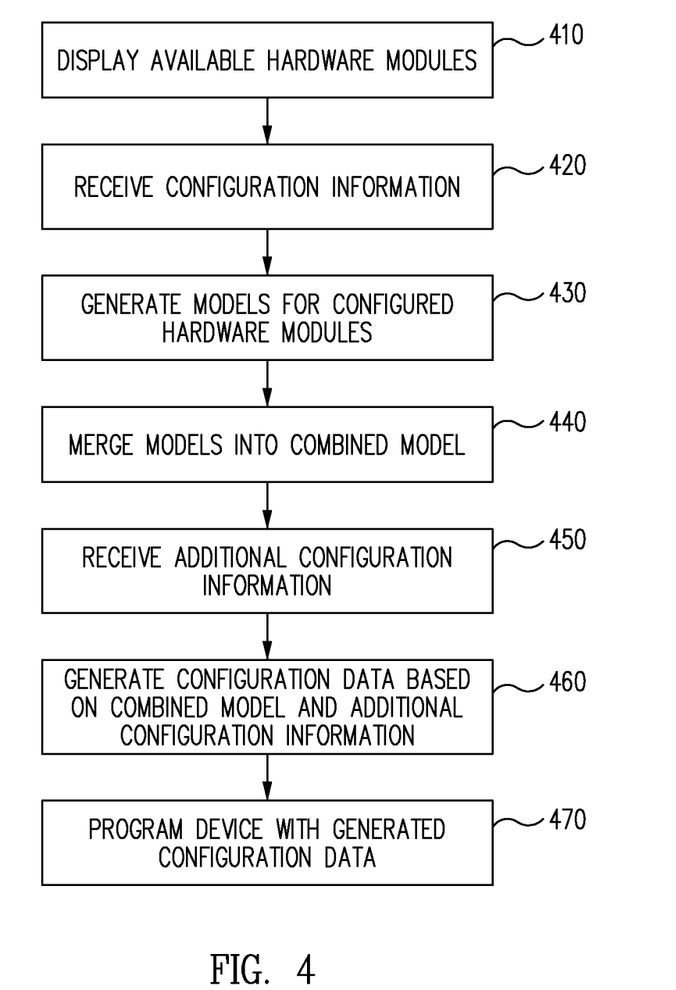
FIG. 4 illustrates a process to configure hardware modules of a PLD in accordance with an embodiment of the disclosure.

FIG. 4 illustrates a process to configure hardware modules of a PLD in accordance with an embodiment of the disclosure. For example, the process of FIG. 4 may be performed by a user interacting with external system 130 running Lattice Diamond software to configure PLD 100.

In operation 410, external system 130 displays hardware modules of PLD 100 that are available to be configured by a user. For example, in some embodiments, external system 130 may display GUI 300 on user interface 135.

In operation 420, the user interacts with external system 130 (e.g., through user input device 137) to provide configuration information for one or more of the hardware modules, for example, in the manner described with regard to FIG. 3. Also in operation 420, external system 130 may perform one or more rule checks to confirm that the configuration information provided by the user describes valid configurations of the hardware modules. For example, external system 130 may reject invalid configurations and/or request the user to provide new configuration information as appropriate.

In operation 430, external system 130 generates a model for each configured hardware module. Each generated model may be a specific instance of a general model of ASB 200. However, each model instance may include only the configuration information for a subset of the hardware modules of ASB 200 as a single level hardware description language (HDL) model (e.g., HDL file). In this regard, each model instance may be a subset of an overall model of ASB 200 and may specify only the aspects of ASB 200 applicable to a portion of ASB 200 (e.g., only a single hardware module or a small number of hardware modules in some embodiments). As a result, each generated model instance is not required to specify all attributes of ASB 200. For example, in some embodiments, ASB 200 may include over 7000 available I/O signal paths that may be separately configured. By limiting each generated model instance to only a subset of ASB 200 (e.g., a single hardware module or a small number of hardware modules configured by the user in some embodiments), the model instances may be generated rapidly and without undue duplication.

Figure 5:
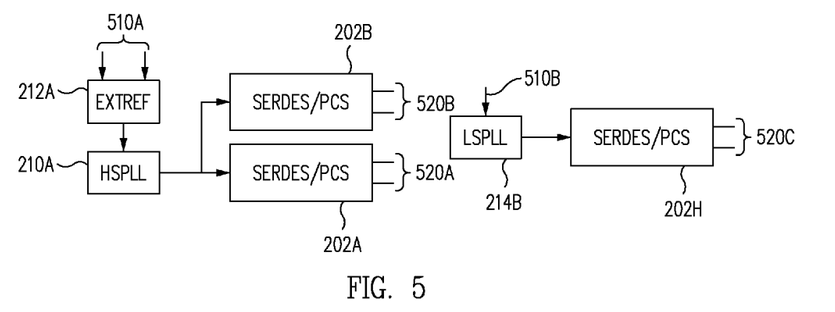
FIG. 5 illustrates a block diagram of several models of hardware modules configured by a user in accordance with an embodiment of the disclosure.

For example, FIG. 5 illustrates a block diagram of several hardware modules of PLD 100 configured by a user in accordance with an embodiment of the disclosure. In the example shown in FIG. 5, some, but not all hardware modules of ASB 200 have been configured and interconnected with each other as well as various input signal paths 510A-B and output signal paths 520A-C. In FIG. 5, each configured hardware module is represented as a specific instance (e.g., a single level HDL model) of a general model of ASB 200. As such, the six model instances shown in FIG. 5 correspond to only a subset of ASB 200 (e.g., each model instance corresponds to one of the hardware modules of ASB 200 configured by the user in this embodiment).

In operation 440, the various models generated in operation 430 are merged together into a single combined hardware model. In this regard, because each generated model is an instance (e.g., a subset) of an overall model of ASB 200, the generated models may be efficiently merged together to provide a comprehensive model of ASB 200. Moreover, by merging together only models of configured hardware modules, any unconfigured hardware modules need not be described or otherwise specified in the combined model of ASB 200. As a result, if one or more hardware modules of ASB 200 are unused in a design, then the combined model of ASB 200 may be significantly reduced in complexity.

The resulting combined model generated in operation 440 may specify interconnections between the various hardware modules. For example, the model generated in operation 430 for a first one of the hardware modules (e.g., EMAC 206D shown in FIG. 3) may include a connection (e.g., connection 350A) between the first hardware module and a signal path (e.g., channel 340A). The model generated in operation 430 for a second one of the hardware modules (e.g., PCIe block 204 shown in FIG. 3) may include a connection (e.g., connection 350B) between the second hardware module and the signal path (e.g., channel 340A). As a result, a combined model merging the configurations of EMAC 206D and PCIe block 204 in operation 440 may effectively include the interconnection between these hardware modules by specifying the configuration of the hardware modules as being connected to the same channel 340A.

Figure 6:
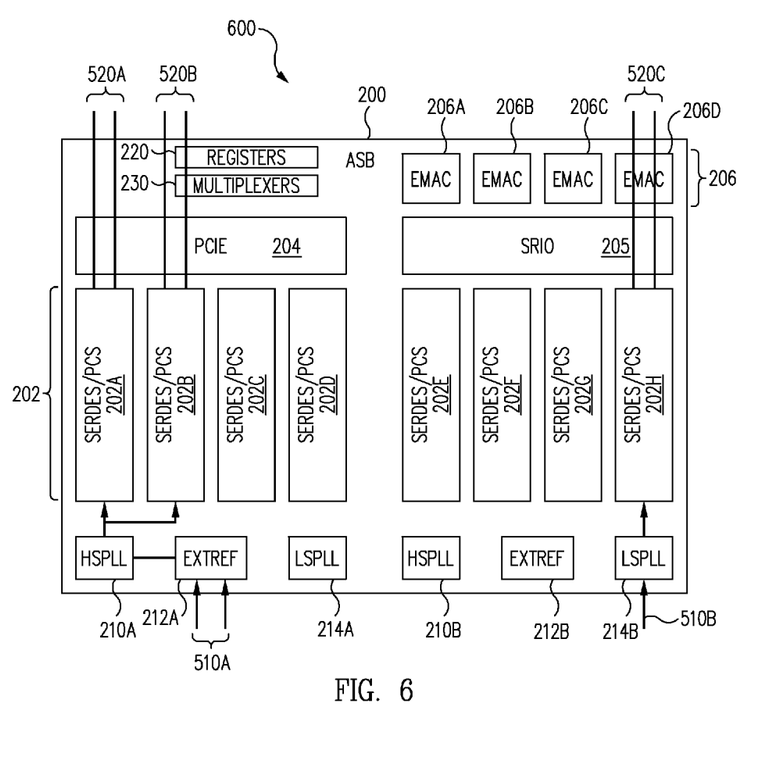
FIG. 6 illustrates a block diagram of a combined model of hardware modules in accordance with an embodiment of the disclosure.

FIG. 6 illustrates a block diagram of a combined model 600 of hardware modules in accordance with an embodiment of the disclosure. As discussed, each of the configured hardware modules of FIG. 5 may be modeled as a specific instance of a general model of ASB 200. In FIG. 6, these model instances have been merged into a combined model 600 of ASB 200. As shown, each of SERDES/PCS modules 202A-B and 202H, HSPLL module 210A, EXTREF module 212A, and LSPLL 214B are connected to various components, input signal paths 510A-B, and output signal paths 520A-C. Because each model instance of ASB 200 includes only the configuration information for a particular hardware block, the model instances can be efficiently merged into combined model 600 without redundancy or hardware resource conflicts.

As shown in FIG. 6, the actual configured modules represent only a subset of the available hardware resources of ASH 200. Accordingly, in some embodiments, any modules of ASB 200 that are not configured (e.g., not represented in one of the merged instances of the ASB 200 hardware model) need not be described in the combined model 600. In this regard, the various unconfigured hardware modules of ASB 200 are shown in FIG. 6 only for contextual purposes and may be omitted from the actual combined model 600 in some embodiments.

In operation 450, external system 130 receives additional configuration information, such as user-specified configurations of programmable logic blocks 104 of PLD 100. In operation 460, external system 130 generates configuration data (e.g., a bitstream) based on the combined hardware model and additional configuration information. In operation 470, such configuration data may be provided to PLD 100 as described to program PLD 100 for its intended use.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A method comprising:
   receiving in a computer system configuration information for a plurality of hardware modules of an embedded hardware block of a programmable logic device (PLD), wherein the configuration information is received from a user of the computer system;
   generating in the computer system a plurality of models for the plurality of hardware modules, wherein a generated model includes the configuration information received for a hardware module; and
   merging in the computer system the generated models into a combined model of the hardware block, wherein the combined model includes the configuration information received for the plurality of hardware modules and interconnections specified between the plurality of hardware modules.

2. The method of claim 1, wherein at least one of the generated models includes the configuration information for a subset of hardware modules of the hardware block.

3. The method of claim 2, wherein the subset includes a single hardware module of the hardware block.

4. The method of claim 1, wherein each generated model is a single level hardware description language (HDL) model.

5. The method of claim 1, wherein:
   the generated model for a first one of the hardware modules includes a connection between the first hardware module and a signal path of the hardware block;
   the generated model for a second one of the hardware modules includes a connection between the second hardware module and the signal path; and
   the combined model specifies the interconnection between the first and second hardware modules using the connections of both the first and second hardware modules to the signal path.

6. The method of claim 1, wherein the hardware block is adapted to pass signals between programmable logic blocks of the PLD and external ports of the PLD.

7. The method of claim 1, wherein the hardware block comprises:
   a serializer/deserializer (SERDES) hardware module;
   a physical coding sublayer (PCS) hardware module; and
   a hard intellectual property core (IP) hardware module.

8. The method of claim 1, further comprising displaying a set of hardware modules to the user in a graphical user interface, wherein the displayed set of hardware modules has a one-to-one correspondence with the hardware modules of the hardware block.

9. The method of claim 1, further comprising generating configuration data based on the combined model, wherein the configuration data is adapted to be programmed into the PLD to configure the PLD for operation.

10. A system comprising:
    a processor; and
    a memory adapted to store a plurality of computer readable instructions which when executed by the processor are adapted to cause the system to perform a method comprising:
    receiving configuration information for a plurality of hardware modules of an embedded hardware block of a programmable logic device (PLD), wherein the configuration information is received from a user of the system,
    generating a plurality of models for the plurality of hardware modules, wherein a generated model includes the configuration information received for a hardware module; and
    merging the generated models into a combined model of the hardware block, wherein the combined model includes the configuration information received for the plurality of hardware modules and interconnections specified between the plurality of hardware modules.

11. The system of claim 10, wherein at least one of the generated models includes the configuration information for a subset of hardware modules of the hardware block.

12. The system of claim 11, wherein the subset includes a single hardware module of the hardware block.

13. The system of claim 10, wherein each generated model is a single level hardware description language (HDL) model.

14. The system of claim 10, wherein:
    the generated model for a first one of the hardware modules includes a connection between the first hardware module and a signal path of the hardware block;
    the generated model for a second one of the hardware modules includes a connection between the second hardware module and the signal path; and
    the combined model specifies the interconnection between the first and second hardware modules using the connections of both the first and second hardware modules to the signal path.

15. The system of claim 10, wherein the hardware block is adapted to pass signals between programmable logic blocks of the PLD and external ports of the PLD.

16. The system of claim 10, wherein the hardware block comprises:
    a serializer/deserializer (SERDES) hardware module;
    a physical coding sublayer (PCS) hardware module; and
    a hard intellectual property core (IP) hardware module.

17. The system of claim 10, wherein the hardware modules are substantially co-located in a region of the PLD.

18. The system of claim 10, wherein the method further comprises displaying a set of hardware modules to the user in a graphical user interface, wherein the displayed set of hardware modules has a one-to-one correspondence with the hardware modules of the hardware block.

19. The system of claim 10, wherein the method further comprises generating configuration data based on the combined model, wherein the configuration data is adapted to be programmed into the PLD to configure the PLD for operation.

20. A programmable logic device (PLD) comprising:
   an embedded hardware block including a plurality of hardware modules, wherein:
      each hardware module can be represented by a model generated by a computer system based on configuration information received for the hardware module; and
      the generated models can be merged in the computer system into a combined model of the hardware block, wherein the combined model includes the configuration information received for the plurality of hardware modules and interconnections specified between the plurality of hardware modules.

* * * * *